(12) United States Patent
Christianson et al.

(10) Patent No.: US 7,701,654 B2
(45) Date of Patent: Apr. 20, 2010

(54) APPARATUS AND METHOD FOR CONTROLLING COMMON MODE VOLTAGE OF A DISK DRIVE WRITE HEAD

(75) Inventors: Jason A. Christianson, Apple Valley, MN (US); David W. Kelly, Eagan, MN (US); Michael John O'Brien, St. Paul, MN (US); Cameron Carroll Rabe, Inver Grove Heights, MN (US)

(73) Assignee: Agere Systems Inc., Allentown, PA (US)

( * ) Notice: Subject to any disclaimer, the term of this patent is extended or adjusted under 35 U.S.C. 154(b) by 786 days.

(21) Appl. No.: 11/521,568

(22) Filed: Sep. 14, 2006

(65) Prior Publication Data

US 2007/0070536 A1    Mar. 29, 2007

Related U.S. Application Data

(60) Provisional application No. 60/720,327, filed on Sep. 23, 2005.

(51) Int. Cl.
*G11B 5/09* (2006.01)

(52) U.S. Cl. .............................. 360/46; 360/66; 360/67; 360/68

(58) Field of Classification Search .................. 360/46, 360/65, 67–68
See application file for complete search history.

(56) References Cited

U.S. PATENT DOCUMENTS

| | | | | |
|---|---|---|---|---|
| 5,287,231 A | * | 2/1994 | Shier et al. | 360/68 |
| 5,668,676 A | * | 9/1997 | Voorman et al. | 360/46 |
| 5,781,046 A | * | 7/1998 | Ngo et al. | 327/110 |
| 6,297,921 B1 | * | 10/2001 | Price et al. | 360/68 |
| 6,356,404 B1 | * | 3/2002 | Nguyen | 360/66 |
| 6,424,480 B1 | * | 7/2002 | Bhandari et al. | 360/67 |
| 6,469,857 B1 | * | 10/2002 | Miyake | 360/67 |
| 6,504,666 B1 | * | 1/2003 | Patti et al. | 360/68 |
| 6,532,123 B1 | * | 3/2003 | Veenstra et al. | 360/46 |
| 6,671,118 B2 | | 12/2003 | Putnam et al. | |
| 6,697,205 B2 | * | 2/2004 | Cyrusian et al. | 360/68 |
| 6,794,880 B2 | * | 9/2004 | Tucker | 324/511 |
| 6,813,110 B2 | * | 11/2004 | Leighton et al. | 360/68 |
| 6,819,515 B1 | * | 11/2004 | Iroaga | 360/66 |
| 6,927,933 B2 | * | 8/2005 | Choi et al. | 360/68 |
| 7,019,923 B2 | | 3/2006 | Leighton et al. | |
| 7,365,928 B2 | * | 4/2008 | Venca et al. | 360/68 |
| 7,417,817 B1 | * | 8/2008 | Aram et al. | 360/68 |
| 2003/0090828 A1 | * | 5/2003 | Venca et al. | 360/61 |
| 2003/0234996 A1 | | 12/2003 | Ngo | |
| 2004/0085667 A1 | * | 5/2004 | Chung et al. | 360/67 |
| 2004/0196581 A1 | | 10/2004 | VanEaton et al. | |
| 2004/0196582 A1 | * | 10/2004 | VanEaton et al. | 360/46 |
| 2005/0007686 A1 | | 1/2005 | Bloodworth et al. | |
| 2006/0012902 A1 | * | 1/2006 | Sharifi | 360/46 |

* cited by examiner

Primary Examiner—Dismery E Mercedes

(57) ABSTRACT

An apparatus and method for controlling the common mode voltage across a data storage device write head. The write current is supplied by a first plurality of parallel current sources each independently activated to limit the common mode voltage generated across the write head. A plurality of parallel resistive elements responsive to current supplied by a second plurality of parallel current sources bias an output transistor that further controls the write current. Each of the plurality of parallel resistive elements and each of the second plurality of parallel current sources is also independently activated to limiting the common mode voltage generated across the write head.

26 Claims, 6 Drawing Sheets

APPARATUS AND METHOD FOR CONTROLLING COMMON MODE VOLTAGE OF A DISK DRIVE WRITE HEAD

This application claims the benefit of U.S. Provisional Patent Application No. 60/720,327 filed on Sep. 23, 2005.

FIELD OF THE INVENTION

The present invention relates generally to an apparatus for supplying write current to a write head of a hard disk drive data storage system and more particularly to an apparatus for reducing a common mode voltage across the write head and associated methods for reducing the common mode voltage.

BACKGROUND OF THE INVENTION

Disk drive storage system are commonly used for storing data in electronic products including digital cameras, music players, computer systems, and the like. As shown in FIG. 1, a disk drive 10 comprises a magnetic recording medium, in the form of a disk or platter 12 having a hub 13 and a magnetic read/write transducer 14, commonly referred to as a read/write head. The read/write head 14 is attached to or formed integrally with a suspension arm 15 suspended over the disk 12 and affixed to a rotary actuator arm 16. A structural arm 18, fixed to a platform 20 is pivotably connected to the actuator arm 16 at a pivot joint 22. A voice coil motor 24 drives the actuator arm 16 to position the head 14 over a selected position on the disk 12 for writing data to the disk 12 or reading data from the disk 12.

A spindle motor (not shown) rotates the disk 12 while the moving air generated by the rotating disk, in conjunction with the physical features of the suspension arm 15, lifts the read/write head 14 away from the platter 12, allowing the head to glide or fly on a cushion of air slightly above an upper surface of the disk 12. The flying height of the read/write head over the disk surface is typically less than a micron.

An arm electronics module 30, electrically connected to the head 14 by flexible conductive leads 32, includes circuits operative during the data read and write operations. Although the module 30 may be mounted anywhere in the disk drive 10, a location proximate the head 14 minimizes signal losses and induced noise in the read and write head signals. A preferred mounting location for the module 30 comprises a side surface of the structural arm 18 as shown in FIG. 1.

As shown in a partial cross-section and partial block diagram of FIG. 2, the disk 12 comprises a substrate 50 and a thin film 52 disposed thereover. Write current supplied to a write head 14A alters magnetic domains of ferromagnetic material in the thin film 52 to store the data bits as magnetic transitions.

Data bits to be written to the disk 12 are supplied by a processing device 60 to a data write circuit 62 where the data bits are formatted and error detection/correction information appended thereto. To write data bits, the voice coil motor 18 moves the suspension arm 16 to a desired radial position above the surface of the disk 12 while the spindle motor rotates the disk 12 to move a circumferential region to be written under the write head 14A.

A write driver 66A of a preamplifier 66 (in one embodiment disposed within the electronics module 30) supplies a programmed write current (in certain applications between about 10 mA and 70 mA) to the write head 14A responsive to a signal representative of the data to be written to the disk 12 supplied by a data write circuit 62.

During a write operation, the write current supplied by the write driver 66A to the write head 14A (magnetically coupled to a magnetically permeable core not shown) creates a magnetic field that extends from the core across an air gap between the write head 14A and the disk 12. The magnetic field alters a region of magnetic domains in the thin film 52 to store data bits.

The direction of the magnetic field generated by the write head 14A, and thus the direction of the altered magnetic domains, is responsive to the direction of current flow through the write head 14A. Current supplied in a first direction through the write head 14A causes the domains to align in a first direction (representing a date 0 for example) and current supplied in a second direction (representing a data 1 for example) causes the domains to align in a second direction.

In the read mode, transitions between adjacent domains are detected to determine the stored data bit. During read operations a read head 14B (typically comprising a magneto-resistive (MR) sensor, a giant magnetoresistive sensor (GMR), or a tunneling magnetoresistive head (TMR)) senses the magnetic field transitions in the thin film 52 to detect the stored data bits.

The suspension arm 16 moves while the disk 12 rotates to position a read head 14B above a magnetized region to be read. A DC (direct current) bias voltage of between about 0.025V and about 0.3V is supplied to the read head 14B by a read circuit 66B of the preamplifier 66. Magnetic domains in the thin film 52 passing under the read head 14B alter a resistance of the magneto-resistive material, imposing an AC (alternating current) component on the DC bias voltage. The AC component representing the read data bits has a relatively small magnitude (e.g., several millivolts) with respect to the DC bias voltage.

The read circuit 66B amplifies the read signals and supplies the amplified voltages to a data read circuit 72 where error detection/correction is performed, and the data bits detected. The data bits are supplied to a user interface 74, such as an interface to a computer or data processing device (e.g., SATA, SCSI, SAS, PCMCIA interfaces). Amplification of the signal in the read circuit 66B reduces the relative noise contribution of the data read circuit 72 when the signal is processed through the circuit 72.

In other data storage systems, the head 14 can operate with different types of storage media (not shown in the Figures) comprising, for example, a rigid magnetic disk, a flexible magnetic disk, magnetic tape, a magneto-optical disk, and the like.

To increase storage capacity, a disk drive may comprise a plurality of stacked parallel disks 12. A read/write head is associated with each surface of each disk to write data to and read data from a top and bottom surface of each disk.

Ideally, the write current supplied to the write head 14A is a purely differential write current. Thus, the current sources that supply the write current are designed to produce symmetrical voltage/current swings during write operations. However, as is known by those skilled in the art, circuit topology, manufacturing processes and parasitic circuit elements introduce aberrations in the write circuit that generate a common mode signal. Also, when the current sources and other components operative during write operations are turned off, for example at the beginning of a read operation, common mode currents (voltages) are generated and introduced into the write head 14A. Common mode voltage spikes of several volts are not atypical at write turn-off.

The magnetoresistive material of the read head 14B cannot tolerate excessive voltages. In contrast, the thin-film inductor of the write head 14A requires relatively large magnitude, sub-nanosecond voltage swings to write data to high data-rate disk drive systems. Due to the close spacing of the read head 14B and the write head 14A, asymmetrical (i.e., common mode) voltages supplied to the write head 14A may be coupled to the read head 14B, potentially damaging or destroying the read head 14B.

Write current is typically supplied by the write driver 66A, comprising a plurality of current sources each controlled by an emitter follower transistor operative with a corresponding bias resistor. One technique for turning off the write current after a data write operation simultaneously deactivates the current sources and opens switches that control a connection between the bias resistor and its corresponding emitter follower transistor. Since the current sources turn off faster than the resistor-controlled switches open, a common mode voltage nearly equal to the supply voltage is imposed across the write head 14A and therefore coupled to the proximate read head 14B. State-of-the-art read heads (e.g., GMR and TMR heads) cannot tolerate such voltage transients.

As one skilled in the art will appreciate, precise turn-off timing is difficult to achieve and becoming more difficult as larger capacity and faster devices are required by today's hard disk drives. Switching misalignment of only tens of picoseconds can cause the switches to deliver a sufficient charge to swing the voltage on the write head 14A from the positive supply voltage to the negative supply voltage.

It is known to use clamps and catches to slowly lower the voltage in response to a change in a switch position. But these techniques are limited to controlling power down excursions and therefore are not usable during power-up, which can also generate common mode voltages in the write head 14A.

It is also known to slowly increase (and decrease) the circuit bias voltages while the switching devices are in the proper state for biasing. However, timing of the bias voltage increase (and decrease) relative to turning on (off) the switching devices must be carefully controlled as the switching devices can deliver a substantial charge. This technique is further discouraged by fast-mode switching requirements of state-of-the-art heads, requiring a fast bias voltage response during both power up and power down. Thus, a need exists for apparatus and methods for controlling common mode voltages in disk drives and/or other storage devices.

BRIEF SUMMARY OF THE INVENTION

According to one embodiment, the invention comprises an apparatus for supplying write current to a write head of a data storage device to write data bits to the data storage device. The apparatus comprises a first and a second control element; a first and a second current source module for producing a respective first and second controllable current; a first and a second biasing module for applying a first and a second controllable bias to the respective first and second control elements and a controller for controlling the first and the second current source modules to control the respective first and second currents and for controlling the first and the second biasing modules to control the bias, wherein the write current supplied to the write head is responsive to a bias condition of the first and the second control elements and to the first and the second currents.

According to another embodiment, the invention comprises a method for supplying write current to the write head of a data storage system. The method further comprises controlling a first current source module to supply incremental amounts of write current to the head to write a first polarity data bit to the disk and controlling a second current source module to supply incremental amounts of write current to the head to write a second polarity data bit to the disk.

BRIEF DESCRIPTION OF THE DRAWINGS

The present invention can be more easily understood and the advantages and uses thereof more readily apparent when the following detailed description of the present invention is read in conjunction with the figures wherein.

In accordance with common practice, the various described device features are not drawn to scale, but are drawn to emphasize specific features relevant to the invention. Like reference characters denote like features elements throughout the figures and text.

DETAILED DESCRIPTION OF THE INVENTION

Before describing in detail the particular method and apparatus related to a writer circuit module for a disk drive system, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or use of the invention, but only to provide exemplary constructions. The embodiments are permissive rather than mandatory and illustrative rather than exhaustive.

Figure 1:
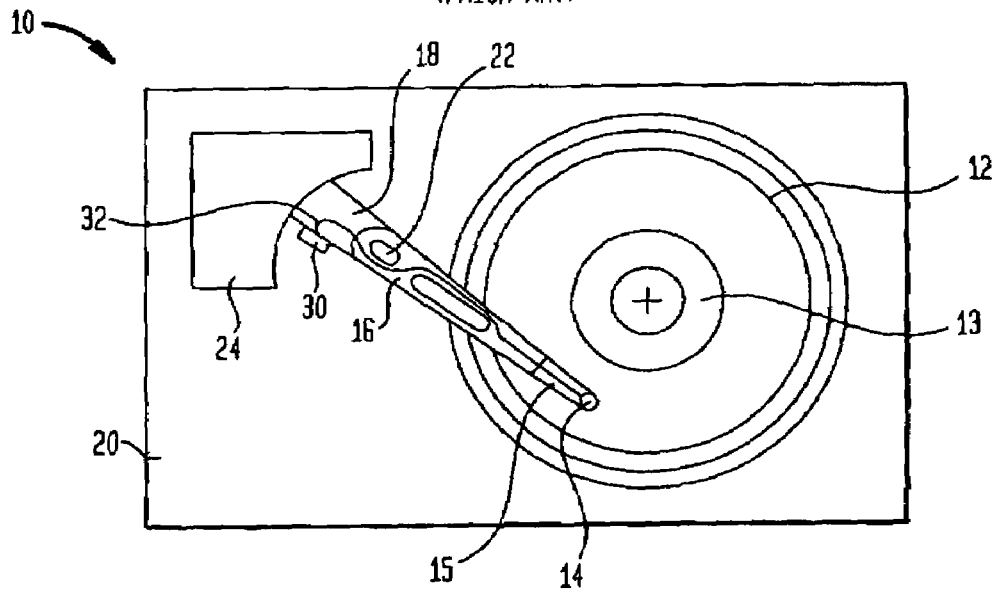
FIG. 1 illustrates a prior art disk drive to which the teachings of the present invention can be applied.
Figure 2:
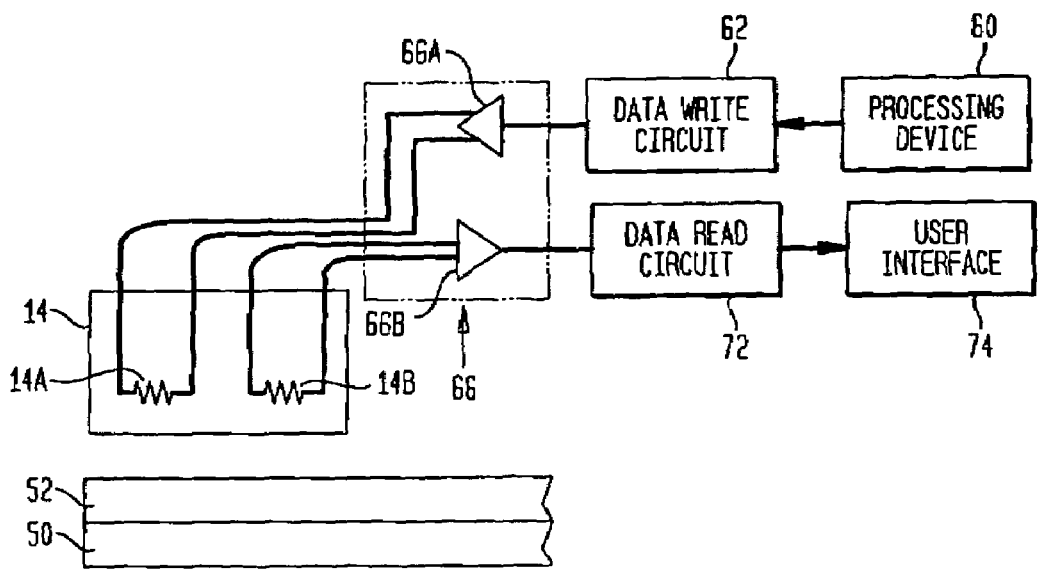
FIG. 2 is a schematic diagram of a prior art head and related components of the disk drive of FIG. 1.
Figure 3A:
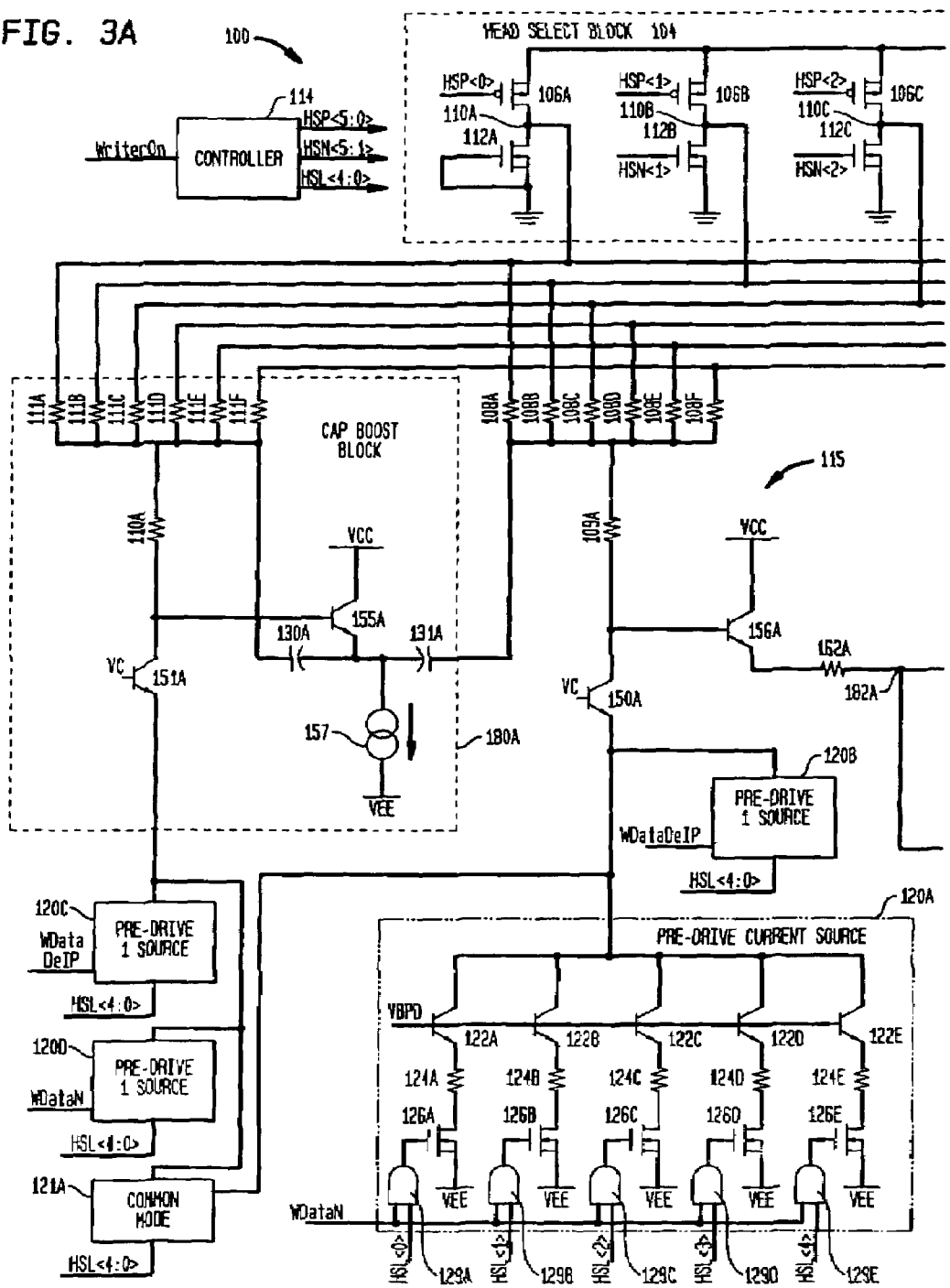
FIG. 3 is a schematic diagram of one embodiment of a writer circuit module of the present invention for use with the disk drives.
Figure 3B:
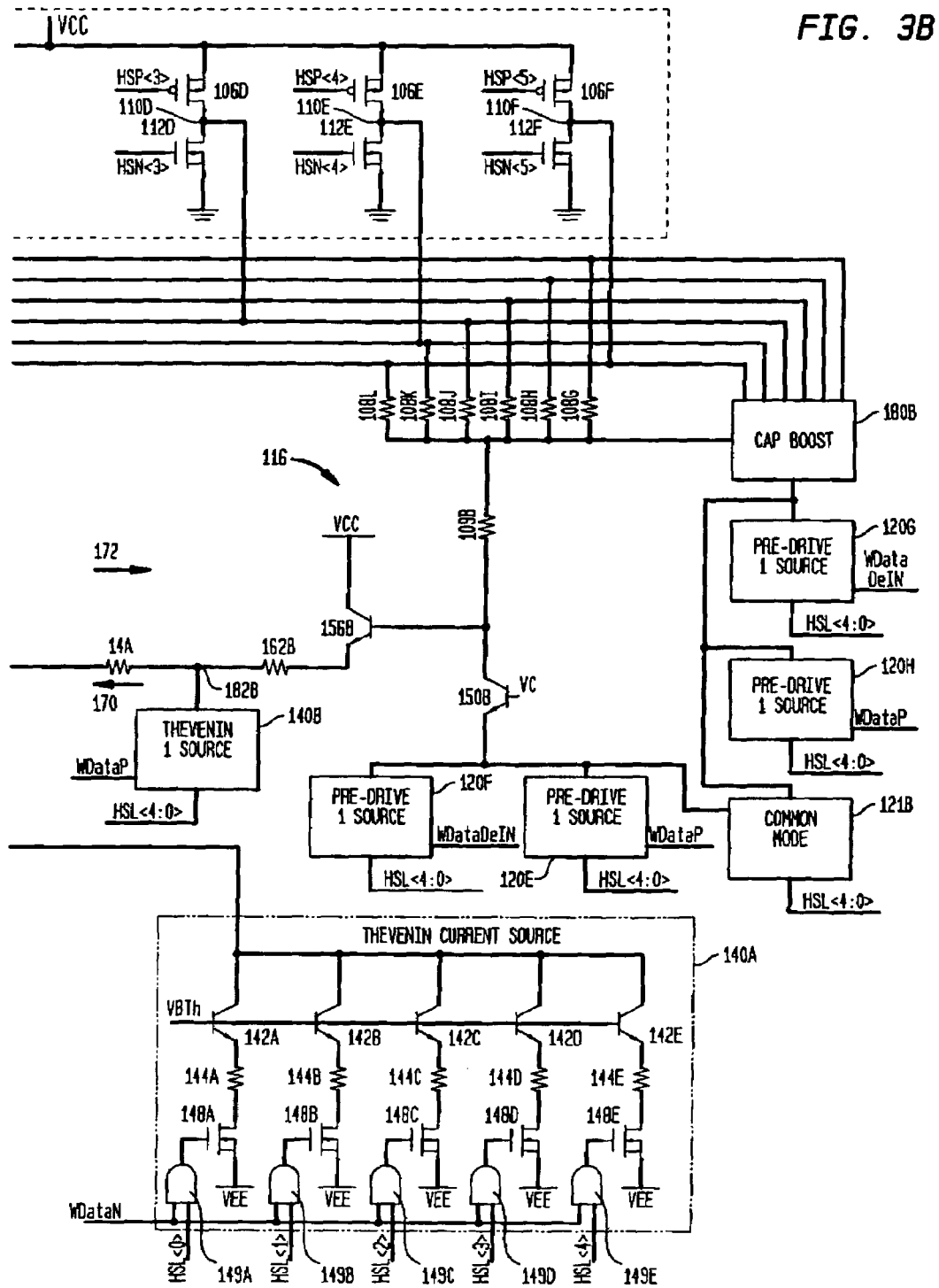

FIG. 3 illustrates a writer circuit module 100 constructed according to at least one embodiment of the present invention for supplying write current with a reduced common mode voltage component to a write head of a disk drive storage system. The writer module 100 comprises a controller 114, a head select module 104 and two mirror-image current-supply half circuits, a left-half circuit 115 and a right-half circuit 116, each half circuit driving (supplying current to) one side of the write head 14A.

The left-half current-supply circuit 115 further comprises pre-drive parallel resistors 108A-108F each connected to the respective node 110A-110F of the head select module 104, a pre-drive resistor 109A, a cascode transistor 150A, an output transistor 156A connected as an emitter follower, an impedance matching resistor 162A, a capacitive boost module 180A, pre-drive current source modules 120A-120D, a common mode control current source module 121A and a Thevenin current source module 140A. The write head 14A is connected between output nodes 182A and 182B of the left-half and right-half current supply circuits 115 and 116, respectively. The right-half current-supply circuit 116 comprises similar components bearing unique reference characters as illustrated.

The left-half and right-half current-supply circuits 115 and 116 cooperate to supply current through the head 14A in a first direction indicated by an arrowhead 170 to write a first polarity bit to the disk 12 or to supply current in a second direction indicated by an arrowhead 172 to write a second polarity bit to the disk 12. While the write current is supplied in a particular polarity, the magnetic field of the head writes an arc of one magnetic polarity as the rotating disk passes under it. When the polarity of the signals controlling the write current reverses the write current direction, the magnetic field polarity reverses and the writer writes an arc of the opposite polarity.

The description below describes the left half circuit 115, but it is readily apparent to someone skilled in the art that the description also applies to the right half circuit 116 of FIG. 3. Additional operational details of certain components described herein may be set forth in commonly-owned U.S. Pat. Nos. 6,813,110 and 7,019,923, which are hereby incorporated by reference.

The write current supplied to the write head 14A (in either the direction indicated by the arrowhead 170 or by the arrowhead 172) comprises an overshoot write current component at the beginning of a data writing interval and a steady-state write current component (in the same direction as the overshoot component) that persists for the remaining duration of the data writing interval. The overshoot current sharpens the transition between writing a bit of a first polarity to writing a bit of a second polarity.

The overshoot and steady state currents magnetize the magnetic domains in the thin film 52 to store the data bits as magnetic transitions. The overshoot current overdrives the write head 14A, i.e., the overshoot current raises the write current above its steady-state value for a short duration. The higher magnitude overshoot current lowers current rise time in the write head 14A, hastens flux reversal when the write current changes direction (i.e., storing a first polarity bit and then changing current direction to store a second polarity bit) and sharpens write current transition edges, thereby accommodating increased areal storage density on the disk 12. A duration of the overshoot current is preferably less than a minimum bit time. After the overshoot interval the steady state current continues until the start of the next bit transition or until the writer is shut off.

Figure 4:
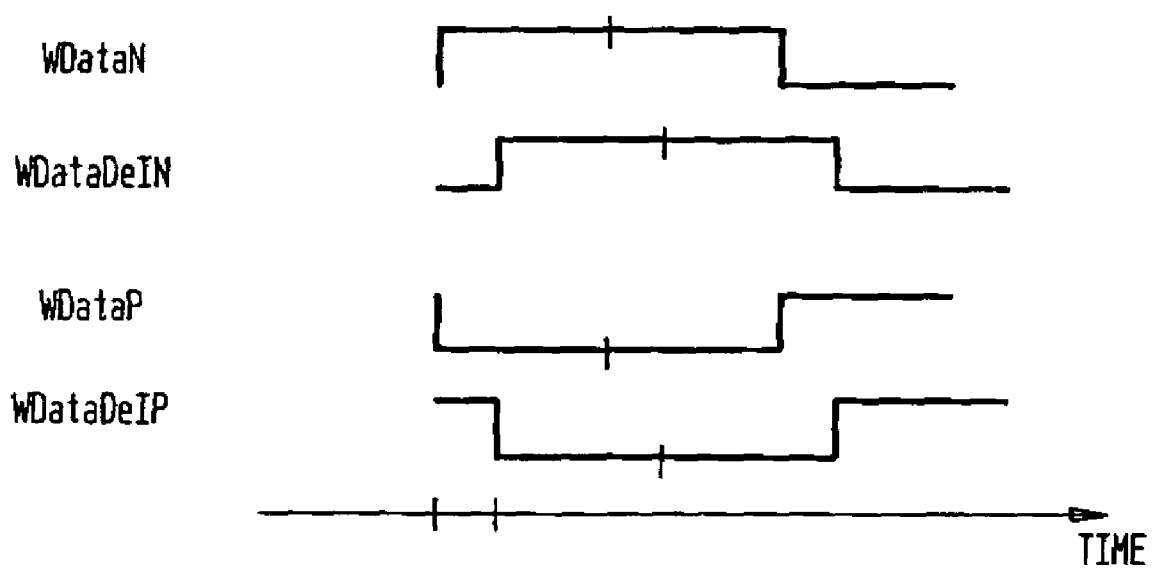
FIGS. 4-6 are timing diagrams illustrating signals for controlling components of the writer circuit module of FIG. 3.
Figure 5:
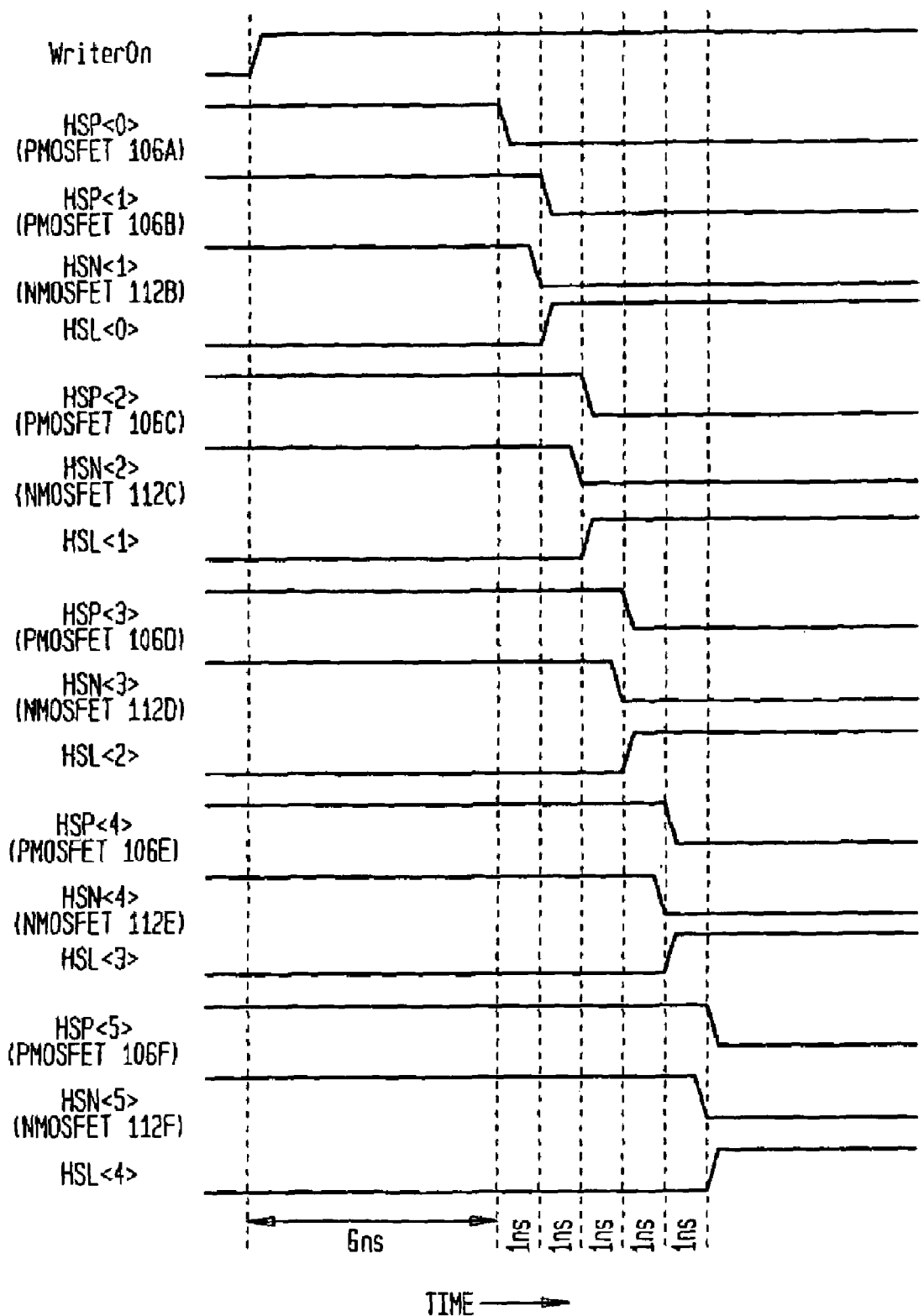
Figure 6:
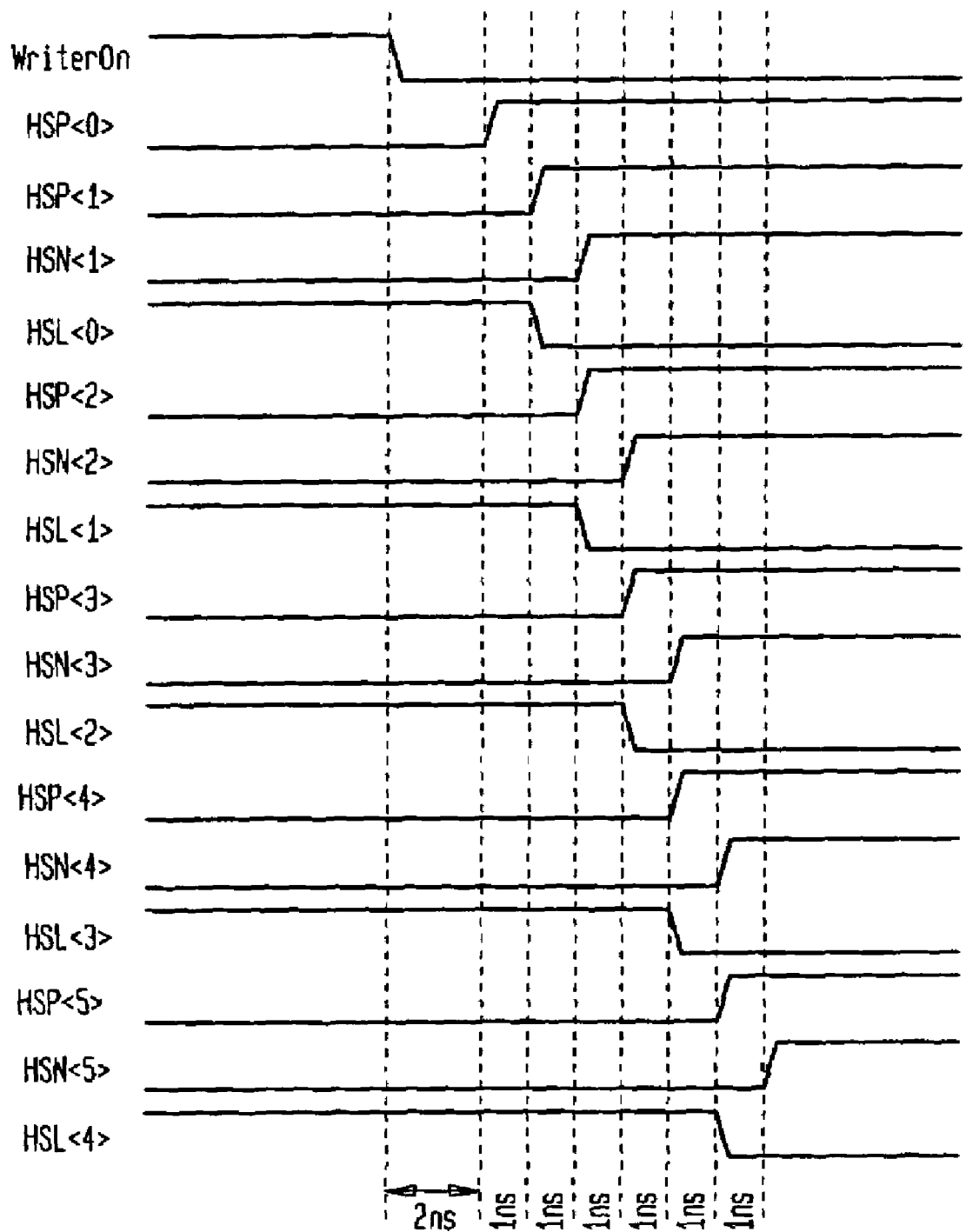

As shown in FIG. 3, the pre-drive current source modules 120A-120F, the Thevenin current source modules 140A and 140B and the common mode control modules 121A and 121B are each controlled by signals illustrated in FIGS. 4-6. The control signals include a WDataN signal, a WDataP signal, a WDataDelN signal (a delayed version of the WDataN signal, i.e., WDataDclN=WDataN after a delay interval (i.e., the overshoot interval) from assertion of WDataN) and a WDataDelN signal (a delayed version of the WDataN signal, i.e., WDataDelP=WDataP after a delay interval (i.e., the overshoot interval) from assertion of WDataP). The referred to delay interval is the overshoot current interval and can range from about 200 ps to about 1 ns. Further, at all times, WDataN=Not(WDataP) and WDataDelN=Not(WDataDelP). See FIG. 4. After the overshoot interval, the states of all four signals are held constant until the next data transition begins. Thus in FIG. 4, the steady state interval is the time from the first transition in the WDataDelP and WDataDelN signals until the next transition in the WDataP and WDataN signals. The differential relation of WDataN and WDataP drives current through the head 14A; the direction of that current is determined by which of the two signals is asserted.

As can be seen in FIG. 3, the various current source modules are controlled by signals designated HSL<4:0>. The effect of these control signals will be considered below in conjunction with the description of the present invention.

To generate write current to write a data bit, the head select module 104 is configured to permit current flow through the resistors 108A-108F and 109A for biasing the base of the output transistor 156A. Details of the configuration and control of the components of the head select module 104 as taught by the present invention are described below.

Assuming a first or N polarity data bit is to be written as represented by current through the write head 14A in the direction of the arrowhead 170, the WDataN signal is asserted and responsive thereto the pre-drive current source module 120A is activated. During the overshoot interval the WDataDelP signal is also asserted as shown in FIG. 4, activating the pre-drive current source module 120B. Thus during the overshoot interval both the current source modules 120A and 120B supply current through the resistors 108A-108F and 109A to bias the base of the output transistor 156A to at least a couple diode voltage drops above VEE to avoid saturating the current sources in the pre-drive current source modules 120A and 120B. Since the bias voltage on the base of the output transistor 156A is responsive to the voltage drop across the resistors 108A-108F and 109A, as the current through the resistors increases, the voltage drop increases and the base voltage approaches VEE. In any case, the base of the output transistor 156A is biased at a voltage below the base of the output transistor 156B (as described below), creating a differential signal across the head 14A. The magnitude of this bias difference governs the amplitude of the overshoot and steady state currents through the head 14A.

For a relatively low amplitude steady state current in the direction of the arrowhead 170, the output node 182B is biased slightly above ground and the output node 182A is biased slightly below ground. The voltage on the base of the output transistor 156A is about one diode voltage above the voltage on the node 182A. The voltage on the base of the output transistor 156B is about one diode voltage above the voltage on the node 182A plus the voltage across the resistor 162B (i.e. a product of the steady state current and the resistance of the resistor 162B). Typically, this voltage is about 350 mV for a steady state current of about 10 mA and a resistor value of about 35 Ohms. During the overshoot interval, for a relatively large overshoot current, these base bias voltages can increase or decrease by as much as four volts, yielding a difference of about eight volts, at which time the lower of the two base voltages can approach within two diodes of VEE.

The overshoot portion of the data writing interval is controlled by the relation between the WDataN signal and its delayed version WDataDelN (and the WDataP signal and its delayed version WDataDelP). During the overshoot interval the delayed signal WDataDelN has not yet changed state, i.e., WDataDelN=Not(WDataN). Responsive to the unasserted WDataDelN signal the pre-drive current source module 120F (in the right-half current supply circuit 116) is off. The pre-drive current source module 120E is also off since WDataP=Not(WDataN). The base of the output transistor 156B is biased at about VCC, but the common mode current source module 121A) provides a DC current when the writer is enabled to ensure that the common mode voltage of the base voltage of the output transistors 156A and 156B is about a diode drop above ground. The current supplied by the common mode current source module 121A (and the common mode current source module 121B) is programmed depending on the overshoot amplitude setting. Without the current supplied by the current sources 121A and 121B, the base of the output transistors 156A and 156B would go to VCC irrespective of the programmed overshoot amplitude, resulting in a common mode voltage that is dependent on the overshoot setting.

To pull the overshoot write current through the head 14A in the direction of the arrowhead 170 current sources (comprising MOSFETS 148A-148E controlling current mirror BJTS 142A-142E) of the Thevenin current source module 140A are activated (turned on hard) (details of the activation process according to the teachings of the present invention are described below) responsive to the asserted WDataN signal causing current to flow from the power supply VCC through the collector-emitter path of the output transistor 156B, through the impedance matching resistor 162B and the write head 14A to the Thevenin current source module 140A and to power supply VEE.

These bias conditions on base of the output transistors 156A and 156B (i.e., the base of the transistor 156A is at about VEE (two diode voltages above VEE for the maximum programmed overshoot current) and the base of the transistor 156B is at about VCC) causes a maximum overshoot current to flow in the direction of the arrowhead 170, as the Thevenin current source module 140A supplies emitter current for the transistor 156B. Thus during the overshoot portion the pre-drive current source modules 120A and 120B and the Thevenin current source module 140A cooperate to increase the current through the write head 14A in the direction of the arrowhead 170.

The overshoot current magnitude is determined by the difference between VEE and the base bias of the output transistor 156A. For a maximum overshoot current, a maximum current is supplied through the resistors 108A-108F from the pre-drive current source module 120A to maximize the resistor voltage drop and move the base closer to VEE.

Both the overshoot current amplitude and the steady state current amplitude are further programmable responsive to the bias voltage VBPD supplied to parallel BJTS 122A-122E of the pre-drive current source module 120A and the bias voltage VBTh supplied to parallel BJTS 142A-142E of the Thevenin current source module 140A. If a lower value of overshoot current is desired, the current supplied by the pre-drive current source module 120A is reduced by lowering the bias voltage VBPD supplied to the module 120A to reduce the current through the resistors 108A-108F and 109A, lowering the resistor voltage drop and pulling the base bias up from VEE. This condition causes some current to flow through the output transistor 156A and thus the current through the head 14A is reduced.

At the end of the overshot portion of the data writing interval the WDataDelN signal is asserted, activating the pre-drive current source module 120F causing current to flow through the resistors 108G-108L and 109B, raising the voltage drop across these resistors and lowering the bias voltage on the base of the output transistor 156B, i.e., moving the bias from about VCC toward VEE to move the transistor toward an "off" condition. The WDataDelP signal is also deasserted to disable the pre-drive current source module 120B, lowering the current through the resistors 108A-108F and 109A and moving the base bias of the output transistor 156A in the direction of an "on" condition. Thus as the output transistor 156B moves toward an "off" condition less current flows through it, and as the output transistor 156A moves toward an "on" condition more current flows through it. The Thevenin current source module 140A continues to pull head current in the direction of the arrowhead 170, but the magnitude of the head current is reduced responsive to the reduced current flow through the output transistor 156B and the increased current flow through the output transistor 156A.

As can be discerned from the discussion above, the bias on the bases of the BJTS 122A-122E in the pre-drive current source module 120A and similar BJTS in the pre-drive current source modules 120B-120D, is a factor in determining the overshoot and steady state write current levels, as these current source modules control the base bias of the output transistors 156A and 156B. The overshoot current amplitude is responsive to the sum of the currents supplied by the current sources 120A and 120B (or the current sources 120F and 120E when the polarity of the bit to be written is reversed) as the sum current determines the base bias for the output transistor 156A. The steady state current amplitude is set by the difference between the current supplied by the pre-drive current sources 120A and 120F (or between the pre-drive current sources 120E and 120B when the polarity of the bit to be written is reversed), as this difference determines the base bias for the output transistor 156A during the steady state interval. Thus there is one base bias voltage for the BJTS within the pre-drive current sources driven by the WDataP and WDataN signals (pre-drive current sources 120A and 120E) and a second base bias voltage for the BJTS within the pre-drive modules driven by the WDataDelP and WDataDelN (pre-drive current source modules 120B and 120F). The sum of these BJT base bias voltages within the pre-drive modules is therefore proportional to the overshoot amplitude and the difference between the base bias voltages is proportional to the steady state amplitude.

Operation of the FIG. 3 components is essentially reversed for writing a second or P polarity data bit to the disk by producing current flow in the direction of the arrowhead 172. The WDataP signal is asserted and responsive thereto pre-drive current source module 120E and 120F (the latter activated because during the overshoot interval the WDataDelN signal is asserted). These current sources supply current through the resistors 108G-108L and 109B to bias the base of the output transistor 156B to about a couple diode voltages above VEE.

During the overshoot portion of the data writing interval the WDataDelP signal has not yet changed state, i.e., WDataDelP=Not(WDataP). Responsive to the unasserted WDataDelP signal the pre-drive current source module 120B (in the left-half current supply circuit 115) is off. Responsive to the signal WDataN=Not(WDataP), the pre-drive current source module 120A is also off. The common mode current source 121B biases the output transistor 156A to an "on" condition with a base voltage of about VCC (limiting the common mode voltage on the bases of the output transistors 156A and 156B).

To pull the overshoot write current through the head 14A in the direction of the arrowhead 172 current sources (comprising MOSFET-controlled current mirrors) within the Thevenin current source module 140B are activated (turned on hard) (details of the activation process according to the teachings of the present invention are described below) responsive to the asserted WDataP signal causing current to flow from the power supply VCC through the collector-emitter path of the output transistor 156A, through the impedance matching resistor 162A and the write head 14A to the Thevenin current source module 140B to VEE. Thus during the overshoot portion the pre-drive current source modules 120E and 120F and the Thevenin current source module 140B cooperate to increase the current through the write head 14A in the direction of the arrowhead 172.

These bias conditions for base of the transistors 156A and 156B (the base of BJT 156A biased close to VCC and the base of the output transistor 156B biased close to VEE) maximize overshoot current in the direction of the arrowhead 172.

During the follow-on steady state portion of the write interval the WDataDelP signal is asserted, activating the pre-drive current source module 120B causing current to flow through the resistors 108A-108F and 109A, lowering the base bias for the output transistor 156A, i.e., moving the base bias from about VCC toward VEE to move the transistor toward an "off"

condition. Also, the WDataDelN signal is deasserted to disable the pre-drive current source module 120F, lowering the current through the resistors 108G-108L and 109B, moving the base bias of the output transistor 156B toward an "on" condition. Thevenin current source module 140B continues to pull current in the direction of the arrowhead 172.

In a preferred embodiment the writer circuit module 100 further comprises the capacitive boost modules 180A and 180B, the former further comprising parallel resistors 111A-111F having a common node connected to a resistor 110A, a cascode transistor 151A, an emitter follower transistor 155A, capacitors 130A and 131A, and a current source 157 to bias the emitter follower transistor 155A.

The capacitor boost module 180A, responsive to currents supplied by the pre-drive current source module 120C (responsive to the WDataDelP signal), the pre-drive current source module 120D (responsive to the WDataP signal) and the common mode current source module 121A supplies a boost current through the resistor 108A (to control the base bias of the output transistor 156A) that overcomes the parasitic capacitances on the collector of the cascode transistor 150A. The general functionality of the capacitor boost circuits 180A and 180B is described in greater detail in the commonly-owned U.S. Pat. No. 6,813,110, which is hereby incorporated by reference. Application of the teachings of the present invention to the capacitor boost modules 180A and 180B is described below.

As can be seen from FIG. 3, according to the teachings of the present invention, the head select module 104 comprises a plurality of parallel fingers or branches, each finger further comprising a PMOSFET 106A-106F (p-type metal-oxide semiconductor field effect transistor) having a drain connected to a drain of an NMOSFET 112A-112F (n-type metal-oxide semiconductor field effect transistor) at a respective node 110A-110F. A source of each PMOSFET 106A-106F is connected to the supply voltage VCC (in one embodiment about 5 VDC) and a source of each NMOSFET 112A-112F is connected to ground. A gate of each of the PMOSFETS 106A-106F and the NMOSFETS 112A-112F is controlled by a respective gate signal supplied over a buss HSP <5:0> and a buss HSN <5:0> by a controller 114 as described further below.

According to one embodiment, the PMOSFETS and NMOSFETS comprise 3.3 volt transistors. The PMOSFET are operated between about 5 V and 1.7 V, 1.7 V applied to the gate for turning the PMOSFET "on." (As commonly known, a cascode transistor in series with the MOSFETS allows the 3.3 V MOSFET to operate at 5 V. The cascode transistors in FIG. 3 are biased by a bias voltage VC.) The NMOSFETS transistors are operated between about 0 V and 3.3 V, with 3.3 V applied to the gate to turn the NMOSFET "on" and about 0 V (ground) applied to turn the NMOSFET off.

Each of the pre-drive current source modules 120A-120D comprises a plurality of parallel switched current source branches, each branch further comprising a bipolar junction transistor (BJT) current-mirror in series relationship with a control MOSFET through a resistor. Activation of the MOSFET activates the current mirror. As can be seen from FIG. 3, the pre-drive current source module 120A comprises the parallel BJTS 122A-122E each having an emitter connected to a drain of a control NMOSFET 128A-128E through a respective resistor 124A-124E. AND gates 129A-129E supply a control signal to the gate of the respective NMOSFET 128A-128E as described further below. The pre-drive modules 120B-120D are similarly constructed. The base bias for the BJTS 122A-122E is discussed above.

A base of the cascode BJT 150A is biased just high enough to keep the current sources within the pre-drive current source modules 120A and 120B from saturating, i.e., the bias is selected to clamp or limit the voltage at the collector of each of the current source BJTS 122A-122E. In one embodiment the base is biased at about a diode voltage above the non-delayed pre-drive current source (module 120A) bias voltage. Note that when the head select module 104 is on, the voltage across the current source BJTS 122A-122E can approach 10 V when the power supply VCC=+5 V and the power supply VEE=−5 V. The BJTS 150B, 150C, 151A and 151B provide the same cascode functionality with respect to their respective pre-drive modules 120B and 120C.

The cascode BJTS 150A, 150B, 151A and 151B serve other purposes, including reducing the capacitance on the base of the BJT output transistors 156A and 156B. Rather than the base capacitance of the BJT 156A being equal to the sum of the capacitances of all the parallel BJTS 122A-122F (and the metal routing parasitic capacitances associated with these transistors) the base sees only the collector of the cascode BJT 150A. If the BJT 150A is placed proximate the output BJT 156A and the resistor 109A, the routing capacitance is also reduced. The cascode BJT 150A (and 150B) also reduce variations in the pre-drive current sources 120A and 120B.

A source of each of the control NMOSFETS 128A-128E is connected to a second power supply voltage VEE (in one embodiment VEE comprises a ground in another embodiment VEE comprises −5 VDC).

The Thevenin current source module 140A comprises a plurality of parallel switched current source branches, each branch further comprising a current mirror BJT 142A-142E having an emitter connected to a drain of a NMOSFET 148A-148E through a resistor 144A-144E. A source of each control NMOSFET 148A-148E is connected to the second power supply voltage VEE. Each of the control NMOSFETS 148A-148E is controlled by a gate signal supplied from a respective AND gate 149A-149E. The Thevenin current source module 140B is similarly constructed.

The base bias voltage for each of the current mirror BJTS 122A-122E and the current mirror BJTS 142A-142E may be independently controlled (biased) to achieve the desired write head current wave shape (steady state and overshoot write currents). Typically the BJTS of the pre-drive current source modules 120A and 120D are biased at one voltage, the BJTS of the pre-drive current source modules 120B and 120C are biased at a second voltage and the Thevinin current source module 140A is biased at a third voltage.

The common mode module 121A in this example comprises two sets of five switched CMOS current mirrors, each set supplying the same current. The module 121A is controlled by an adjustable DC value to compensate the currents provided by pre-drive current source modules 120A-12D and the Thevenin current source module 140A to maintain the writer common mode voltage approximately centered between the supply voltages VCC and VEE. Unlike the pre-drive current source modules 120A and 120D and the Thevinin current source module 140A, the currents provided by the module 121A do not switch responsive to writing a first or a second polarity bit to the disk.

To minimize the common mode voltage on the write head 14A it is desired to bias the base of the output BJTS 156A and 156B in a complementary fashion. The common mode voltage at the two bases is about 1 diode voltage above ground. If one of the bases is biased at about one volt above that desired common mode voltage, then the other is biased at about one volt below the desired common mode voltage.

Prior art writer circuit modules do not provide the ability to incrementally enable and disable the writer output, as taught by the present invention. Thus in the prior art, the parallel branch resistors 111A-111F and 108A-108F are absent (a single resistor is used in place thereof) and the head select module, the Thevenin current source module and the pre-drive current source modules each comprise only a single current source. By providing separately controllable current source branches (in the bottom half of the left-half and right-half current-supply circuits 115 and 116) and separately controllable current sources operative with the resistor branches (in the top half of the left-half and right-half current-supply circuits 115 and 116), the invention allows incremental enabling and disabling of the writer, avoiding large transients that would likely occur if all current source and resistor branches were enabled or disabled at the same time.

In the prior art writer circuit module, when the writer is enabled, but prior to writing a first or a second polarity bit to the disk, the head select module switches on first, switching the single resistors in place of the resistor branches 111A-111F/108A-108F from ground to VCC, (responsive to a single series NMOSFET and PMOSFET of a head select module) pulling up the voltage at output nodes 182A and 182B to about one diode voltage below VCC. After some delay the pre-drive current source modules and the Thevenin current source module are activated to supply the write current and the current pulled through resistors lowers the voltage at the bases of the output transistors to about a diode above ground, pulling the writer output nodes 182A and 182B near ground (common mode). The read head 14B will be damaged if these large transients are capacitively coupled to it. To increase the density of stored bits on the disk, the read and write heads are separated by a very small distance, thus it is not feasible to increase the distance between the heads to reduce the capacitive coupling. The transients can also be coupled to other components of the head assembly and can also arc to the disk.

Similarly, when the writer is deactivated, another potentially damaging transient can be produced. In addition to coupling to the read head, coupling to other parts of the head assembly can cause arcs to the disk.

According to the present invention, current sources of the pre-drive current source modules 120A-120D and the Thevinin current source module 140A comprise plural current source branches, permitting each current source branch to be independently activated to supply incremental current through the resistor branches 108A-108L and to supply incremental current to the write head 14A. When the inevitable variations in control signal delay cause mismatches in the timing of the current source switching (i.e., the current sources in the pre-drive current source modules 120A-120F, the Thevenin current source modules 140A and 140B and the common mode current source modules 121A and 121B) and the resistor switching (the resistors 108A-108L as controlled by the head select block 104) any common mode transient voltages produced thereby are limited to a fraction of the common mode transients that occur in the prior art when, in effect, all current sources and associated resistors are switched simultaneously, creating a substantially greater common mode transient across the head 14A.

The timing control signals shown in the thing diagram of FIG. 5 should be optimized for the specific circuit implementation to minimize common mode transients, but this typical example illustrates the principles of the present invention. To write data to the disk, a writer enable sequence is initiated on the rising edge of a control signal, WriterOn, supplied to the controller 114 of FIG. 3. An initial delay of about 6 ns allows settling time for the analog bias voltages on the bases of the BJTS and gates of the NMOSFETS and PMOSFETS of the various modules in FIG. 3.

After the 6 ns delay, the first PMOSFET head select switch 106A is activated when a signal HSP<0> supplied from the controller 114 goes low. Current from the source VCC through the resistor 108A pulls the base of the output transistor 156A to about 1 volt, bringing the head voltage (the voltage at the output node 182A) to between about 0 and 500 mV above ground. In the illustrated example the NMOSFET switch 112A is always held in an off condition. Theoretically the NMOSFET 112A can be removed from the circuit, but its body diode may provide some enhanced protection for the PMOSFET 106A.

After about 1 ns the NMOSFET 112B is deactivated, i.e., turned off when a control signal HSN<1> goes low. Shortly thereafter, the PMOSFET 106B is activated when a control signal HSP<1> goes low. Activating the PMOSFET 106B after the NMOSFET 112B has been deactivated prevents shoot-through current.

The current sources controlled by the NMOSFETS 128A and 148A (within the pre-drive current source modules 120A and the Thevenin current source module 140A) are activated simultaneously with the PMOSFET 106B, responsive to the signal HSL<0> applied to a first input terminal of the AND gate 129A as illustrated in FIG. 3. As seen in FIG. 4, the signals HSP<1> and HSL<0> simultaneously change state. Assuming that an N polarity bit is to be written, the signal WDataN supplied to a second input terminal of the AND gate 129A, triggering the NMOSFET 128A into conduction.

Although not specifically illustrated in FIG. 3, a current source branch in the pre-drive current source module 120B is also gated into conduction through an AND gate responsive to the signal HSL<0> and WDataDelP. Recall that when writing an N polarity bit, there is a time period (the overshot interval) when both the WdataN and the WDataDelP signals are asserted (see FIG. 4). Thus during this overshoot interval the pre-drive current source modules 120A and 120B both pull current through the BJT 150A and affect the base bias of the output transistor 156A.

Assuming that no data is being written during the writer sequencing interval, then the writer is in a steady state condition and WDataN=WDataDeN=Not(WDataP)=Not(WDataDelP). The positive voltage pull on the base bias caused by the on state of the PMOSFET 106B through the resistor 108B is offset by the negative pull of the single activated current source in each of the pre-drive current modules 120A and 120B, with the relative state of the WDataN and WDataDelP signals determining if the resulting output voltage at the output node 182A is slightly positive or slightly negative. In this steady state, the differential output voltage of the output nodes 182A and 182B is small. Thus each side of the write head 14A is slightly positive or slightly negative, depending on the state WDataN and WDataP, i.e., which one is asserted.

In one embodiment of the invention no data switching occurs (that is, no changes in the WDataN and WDataP signals) until all current source branches are turned on/off according to the present invention. In another embodiment the writer data is switched during the writer enable and disable sequences, with a resulting write current waveform amplitude that is proportional to the number of enabled current source segments in the pre-drive and Thevenin current sources modules. During the writer turn-on the signal amplitude grows as each new current mirror leg or branch is enabled; during turn-off sequencing the signal amplitude decreases as current source legs are disabled.

The NMOSFET 148A of the Thevenin current source module 140A is similarly triggered into conduction responsive to the signals HSL<0> and WDataN supplied to the AND gate 149A. Note the current supplied by the Thevenin current source module 140A has little affect on the base bias of the output BJT 156A and can therefore be reasonably ignored in determining that base bias.

Since the polarity of the data signals WDataP and WData-DelN in the right-half current supply circuit 116 are opposite to the data signals WDataN and WDataDelP described above (i.e., WDataN=Not(WDataP) and WDataDelP=Not(WData-DelN)), the polarity of the resulting output voltage at the output node 182B is opposite in polarity to the output voltage on the output node 182A. Thus the net common mode change at the head 14A is about zero.

Note further that the pre-drive current supply modules 120C and 120D, the common mode current supply module 121A and the branch resistor 111B associated with the capacitor boost block 180A, and the pre-drive current supply modules 120G and 120H, the common mode current supply module 121B and the branch resistor 108H associated with the capacitor boost block 180B are simultaneously controlled to supply balanced voltages at the output terminals 182A and 182B and accordingly limit the common mode voltage on the head 14A. Although the capacitor boost blocks 180A and 180B provide a benefit during data writing transitions, the capacitor boost blocks 180A and 180B are sequenced on and off to prevent them from inducing transients during writer turn on and turn off.

The signal HSL<0> remains asserted (as shown in FIG. 5) and thus the activated control MOSFETS and current source remain active during the subsequent timing cycles.

After another 1 ns delay, the next set of head select/resistor and current source fingers illustrated in FIG. 3 is activated. The signal HSN<2> deactivates the NMOSFET 112C then the signal HSP<2> activates the PMOSFET 106C. Current flows through the branch resistors 108C and 108I. Assuming operation during the steady state write interval, the signals WDataN and WDataDelN are asserted, the signal HSL<1> activates the NMOSFET 128B in the pre-drive current source module 120A and the corresponding NMOSFET in the pre-drive current source module 120F, activating the respective current sources. The base bias of the output transistor 156A is thus determined by the value of these three currents and the three currents produced during the previous time interval when HSL<0> was driven high. Although the current source branch switching is described for the steady state write interval, the basic operation is essentially unchanged during the overshoot interval, although different pre-drive current sources are operative in the overshoot interval as described above.

Simultaneously, a current source in each of the pre-drive current source modules 120E and 120F in the right-half current supply circuit 116 is activated. The current supplied by these two current sources, in conjunction with the current through the resistors 108I and 109B initiated during the first interval as described above, determine the base bias for the output transistor 156B and thus the voltage on the output node 182B.

The capacitor boost blocks 180A and 180B, responsive to current supplied by the respective pre-drive current source modules 120C/120D and 120G/120H and the common mode current source module 121A/121B, and the Thevenin current source modules 140A and 140B are also activated in the left and right current supply circuits responsive to the signal HSN<2> to maintain the minimal common mode signal across the head 14A.

This process continues until all current sources in the left-half and right-half current supply circuits 115 and 116 are activated. Since current source activation proceeds symmetrically in the left and right half current supply circuits, the common mode voltage across the write head 14A is minimized.

The time duration between the various switching actions illustrated in FIG. 5 is dependent primarily on the implementation of the writer circuit module 100 in a specific disk drive system. In an embodiment comprising six fingers in the head select module 104 as illustrated in FIG. 3 requiring a 6 ns turn-on time for the disk drive system, the duration between the switching action for successive branches (i.e., the HSL<4: 0> signals) is about 1 ns. In another embodiment of the present invention having 16 fingers to be switched with a system switching requirement of 10 ns, the duration between switching actions is about 0.0625 ns. The switching technique of the present invention allows sufficient time for the switched voltages to settle before the next switching action occurs.

The output transistor base bias voltage excursions exhibited by the present invention are a fraction of the total switching capability of the writer circuit module 100 and are therefore significantly less likely to result in head damage than the prior art techniques. Common mode voltage transients on the write head are minimized when switching the resistor branches 108A-108F/109A and 108G-108L/109B by the head select module 104 and switching the current sources of the pre-drive current source modules 120A, 120B, 120E and 120F is optimally timed. Optimal timing is achieved when a positive-going common mode transient due to switching of a resistor branch from ground to VCC is canceled by a negative-going transient due to the activation of a current source. However, in the case where the timing is not optimal, the common mode transient generated when one resistor branch is switched (according to the teachings of the present invention the resistor branches and the current sources are switched independently and sequentially) is limited by voltage division across the resistor array (where some resistors are connected to VCC, while others are connected to ground via the head select module 104). The common mode transient due to activation a segment of a pre-drive current source, when that activation is not optimally timed, is therefore limited to the product of that current source and (resistor 109A plus the parallel resistance of the resistor segments 108A-108F or the resistor 109B and the resistor segments 108G-108L). The delay between the switching of each resistor or current source segment (nominally set to 1 ns in one embodiment) should be longer than the greatest expected variation from optimal timing. Thus the segmentation of the resistors and current sources makes writer circuit module of the present invention more tolerant of imperfect timing by limiting the magnitude of the resulting common mode transients.

Other embodiments of the present invention employ different timing sequences than illustrated in FIG. 5 (and FIG. 6 described below), for example, certain MOSFETS may not be gated on/off concurrently with gating on/off other MOSFETS, e.g., the PMOSFET 106B may not be gated on at the same time the NMOSFET 128A is gated on. Certain simultaneous gating actions illustrated in FIG. 5 (and FIG. 6) are designed to limit the total turn on or turn off time of the head select module 104 and the various current source modules. Other timing sequences can be used in other embodiments when the total turn on and turn off time of these modules is not a constraint. However, generally it is not preferred to simultaneously turn off or turn on more than a single finger of any one of the head select module 104 and the current source modules as to do so increases the common mode voltage applied to the head.

Whenever it is desired to turn the writer circuit module 100 off, for example, immediately prior to a data read interval or during an idle or power-conserving period of the data processing device, the turn-off process according to the present invention minimizes the common mode signal energy, since any such common mode energy generated in the writer circuit module 100 is present across the write head 14A and coupled into the read head 14B and other head assembly components. Depending on the magnitude of the common mode signal, the energy can saturate the read head 14B, damaging or destroying the head or disrupting reading of the initial data bits until the common mode read head energy dissipates. A large common mode signal can also cause arcing to the disk and damage to the magnetic media.

FIG. 6 shows the timing for writer deactivation. The first delay is 2 ns rather than 6 ns, but this time is not a critical deactivation parameter. It is primarily a side effect of certain level translator delays. The deactivation sequence follows in a similar fashion to the activation sequence, but with the NMOSFET head select activation delayed from its associated PMOSFET device deactivation by an entire 1 ns delay. This PMOSFET to NMOSFET delay allows enough time to assure that the large PMOSFET device is deactivated before the much smaller NMOSFET devices is activated, preventing shoot through current.

By sequentially turning off individual parallel fingers of the head select module 104 and the various current source modules, the base of the BJTS 156A and 156B is stepped toward ground and the current sources within the current source modules are incrementally deactivated to limit formation of common mode signal energy between the write head 14A and ground.

Although the various current source modules of FIG. 3 are illustrated as comprising a specific number of parallel fingers, the invention is not limited to the illustrated embodiment. Other embodiments comprising more or fewer parallel fingers are considered within the scope of the invention.

As described above, the magnitude of the overshoot and steady state currents are controlled by controlling the base bias voltages on the BJT current sources (including the illustrated BJTS 122A-122E and 142A-142E) of the pre-drive current sources and the Thevenin current sources, which in combination determine the overshoot and steady state writer current. That is, the illustrated base bias voltages VBPD and VBTh are varied to affect the current magnitudes.

In yet another embodiment the NMOSFETS 128A-128E and 148A-148E (and the MOSFETS of the pre-drive current source modules 120B-120H and of the Thevenin current source module 140B) can be controlled between a hard off and a hard on condition to influence the current supplied by the pre-drive current source modules and the Thevenin current source modules. However, switching the NMOSFETS over less than a full voltage range may degrade switching speed of the MOSFETS.

In another embodiment, one or more of the MOSFETS and BJTS as described herein is replaced by an opposite polarity MOSFET or BJT. The associated gate drive signals and power supply voltages are modified to accommodate the doping characteristics of the opposite polarity MOSFET or BJT, while providing the functionality of the present invention. Further, throughout the description of the present invention, the phrase "high" signal value means a "true" or an "asserted" state. Those skilled in the art recognize that other signal values can also be associated with a "true" or an "asserted" logic state with a corresponding change in the device responsive to the logic state. Those skilled in the art further recognize that in other embodiments the teachings are applicable to a write head for writing data to other data storage devices.

While the present invention has been described with reference to preferred embodiments, it will be understood by those skilled in the art that various changes may be made and equivalent elements may be substituted for the elements thereof without departing from the scope of the invention. The scope of the present invention further includes any combination of elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. An apparatus for supplying write current to a write head of a data storage device to write data bits to the data storage device, the apparatus comprising:
   a first and a second control element;
   a first and a second current source module for producing a respective first and second controllable current;
   a first and a second biasing module for applying a first and a second controllable bias to the respective first and second control elements; and
   a controller for controlling the first and the second current source modules to control the respective first and second currents and for controlling the first and the second biasing modules to control the bias, wherein:
   the write current supplied to the write head is responsive to a bias condition of the first and the second control elements and to the first and the second currents; and
   the first and the second current source modules each comprises a plurality of independently controllable parallel current source branches each supplying a branch current and each independently controlled by the controller, and wherein a sum of the branch currents of the first current source module comprises the first current and a sum of the branch currents of the second current source module comprises the second current.

2. The apparatus of claim 1 wherein each of the plurality of current source branches of the first and the second current source modules comprises a series connection of a current source, a first transistor and a second transistor, each of the first and the second transistors having a terminal responsive to a respective first and second control voltage.

3. The apparatus of claim 2 wherein the first transistor comprises a bipolar junction transistor and the first control voltage comprises a base bias voltage, and the second transistor comprises a MOSFET, and wherein the second control voltage applied to a gate of the MOSFET activates the current source branch and the base bias voltage controls the branch current.

4. The apparatus of claim 3 further comprising a logic gate for supplying the second control voltage to the gate of the MOSFET, wherein the logic gate is responsive to a first input signal determined by a data bit to be written to the data storage device and a second input signal supplied by the controller for activating the current source branch.

5. The apparatus of claim 3 wherein the MOSFET of each current source branch is controlled to a hard off condition or a hard on condition to control the branch current.

6. The apparatus of claim 2 wherein the first transistor comprises a bipolar junction transistor and the first control voltage comprises a base bias voltage, and the second transistor comprises a MOSFET, and wherein the second control voltage applied to a gate of the MOSFET and the base bias voltage control the branch current.

7. The apparatus of claim 1 wherein the first and the second biasing modules each comprises a plurality of independently controllable parallel current source branches each current source branch independently controlled by the controller and each supplying a branch current, the branch currents cooperating with a plurality of independently controllable parallel resistor branches for biasing the respective first and second control elements.

8. The apparatus of claim 7 wherein each of the plurality of resistor branches comprises a resistor, a third control element connected to a voltage source and connected to the resistor at a node, and a fourth control element connected between the node and ground, and wherein the third control element is operative to a substantially closed condition to permit current supplied by one or more of the plurality of current source branches to flow through the resistor and is operative to a substantially open condition to disconnect the resistor from the voltage source, and wherein the fourth control element is operative to a substantially closed condition to ground the node and is operative to a substantially open condition.

9. The apparatus of claim 8 wherein at a beginning of a data write interval the controller sequentially controls each one of the plurality of resistor branches by opening the fourth control element of one branch and closing the third control element of the same branch.

10. The apparatus of claim 8 wherein each of the plurality of current source branches of the first and the second biasing modules comprises a series connection of a current source, a first transistor and a second transistor, each of the first and the second transistors having a terminal responsive to a respective first and second control voltage.

11. The apparatus of claim 10 wherein the first transistor comprises a bipolar junction transistor and the first control voltage comprises a base bias voltage, and the second transistor comprises a MOSFET, and wherein the second control voltage applied to a gate of the MOSFET activates the current source branch and the base bias voltage controls the branch current.

12. The apparatus of claim 11 further comprising a logic gate for supplying the second control voltage to the gate of the MOSFET, wherein the logic gate is responsive to a first input signal determined by a data bit to be written to the data storage device and a second input signal supplied by the controller for activating the current source branch.

13. The apparatus of claim 11 wherein the MOSFET of each current source branch is controlled to a hard off condition or a hard on condition to control the branch current.

14. The apparatus of claim 10 wherein the first transistor comprises a bipolar junction transistor and the first control voltage comprises a base bias voltage, and the second transistor comprises a MOSFET, and wherein the second control voltage applied to a gate of the MOSFET and the base bias voltage determine the branch current.

15. The apparatus of claim 8 wherein the first and the second control elements each comprises a respective first and second transistor each having a collector connected to a voltage source, an emitter in a current path including the write head and a base, and wherein the plurality of resistor branches of the first and the second biasing modules are connected between the collector and the base of the respective first and second transistor and responsive to current supplied by the plurality of current source branches of the respective first and second biasing modules to bias the base.

16. The apparatus of claim 1 wherein the controller controls the first and the second current source modules to incrementally control the write current during a data writing interval and controls the first and the second biasing modules to incrementally control the bias on the first and the second control elements during the data writing interval.

17. The apparatus of claim 1 wherein the first biasing module comprises a first pre-drive current source module operative during an overshoot write current interval and during a steady state write current interval, and further comprises a second pre-drive current source module operative only during the overshoot write current interval, and wherein the first and the second pre-drive current source modules are operative when a first polarity bit is written to the disk, and wherein the second biasing module comprises a third pre-drive current source module operative during the overshoot write current interval and during the steady state write current interval and further comprises a fourth pre-drive current source module operative only during the overshoot write current interval, and wherein the third and the fourth pre-drive current source modules are operative when a second polarity bit is written to the disk.

18. The apparatus of claim 1 further comprising a first capacitor boost module for supplying a first boost current to affect the bias of the first control element, wherein the first boost current is incrementally supplied responsive to the controller, the apparatus further comprising a second capacitor boost module for supplying a second boost current to affect the bias of the second control element, wherein the second boost current is incrementally supplied responsive to the controller.

19. The apparatus of claim 1 wherein the controller controls the write current to control a common mode voltage on the write head.

20. The apparatus of claim 1 wherein the write current comprises an overshoot interval and a steady state write interval, and wherein the controller controls the write current during a transition from the overshoot interval to the steady state interval, during a transition from the steady state interval to an off condition, during a transition from the off condition to an overshoot condition and during a transition from the steady state interval for writing a first polarity data bit to an overshoot interval for writing a second polarity data bit.

21. The apparatus of claim 1 wherein the data storage device comprises a disk drive.

22. An apparatus for supplying write current to a write head of a data storage device to write data bits to the data storage device, the write current having an overshoot interval and a steady state interval apparatus comprising:
 a first and a second control element;
 a first and a second current source module for producing a respective first and second controllable current;
 a first and a second biasing module for applying a first and a second controllable bias to the respective first and second control elements, and
 a controller for controlling the first and the second current source modules to control the respective first and second currents during the overshoot interval or the steady state interval and for controlling the first and the second biasing modules to control the bias during the overshoot interval or the steady state interval, wherein:
  the write current supplied to the write head during the overshoot interval and the steady state interval is responsive to a bias condition of the first and the second control elements and to the first and the second currents; and the first and the second current source modules each comprises a plurality of independently controllable parallel current source branches each supplying a branch current and each independently controlled by the controller, and wherein a sum of the branch currents of the first current source module comprises the first current and a sum of the branch currents of the second current source module comprises the second current, and wherein the first and the second biasing modules each comprises a plurality of independently controllable parallel current source branches each current source branch independently controlled by the controller and each supplying a branch current, the branch currents cooperating with a plurality of independently controllable parallel resistor branches for biasing the respective first and second control elements.

23. The apparatus of claim 22 wherein the data storage device comprises a disk drive.

24. A method for supplying write current to the write head of a data storage system, comprising:

controlling a first current source module to supply incremental amounts of write current to the head to write a first polarity data bit to the disk; and controlling a second current source module to supply incremental amounts of write current to the head to write a second polarity data bit to the disk, wherein each of the first and the second current source modules comprises a respective first and second plurality of parallel current source branches each further comprising a current source, and wherein the step of controlling the first current source module further comprises independently activating each of the current sources of the first plurality of current sources and the step of controlling the second current source module further comprises independently activating each of the current sources of the second plurality of current sources.

25. The method of claim 24 further comprising controlling a voltage bias on a control terminal of a first control element by incrementally activating each of a third plurality of parallel current sources and each of a first plurality of parallel resistive elements responsive to current supplied by the third plurality of current sources, wherein the voltage bias of the first control element is responsive to a current through activated resistive elements of the first plurality of resistive elements, the method further comprising controlling a voltage bias on a control terminal of a second control element by incrementally activating each of a fourth plurality of parallel current sources and each of a second plurality of parallel resistive elements responsive to current supplied by the fourth plurality of current sources, wherein the voltage bias of the second control element is responsive to a current through activated resistive elements of the second plurality of resistive elements.

26. The method of claim 25 wherein certain ones of the third and fourth plurality of parallel current sources are activated only during an overshoot portion of a write current interval.

* * * * *